United States Patent
Dallinger et al.

(10) Patent No.: US 9,032,820 B2
(45) Date of Patent: May 19, 2015

(54) PROTECTIVE DEVICE FOR A TEST INSTALLATION

(75) Inventors: Frank Dallinger, Stuttgart (DE); Rudi Kaiser, Yongin-Si (KR); Jannis Stemmann, Wuxi (CN); Rainer Kern, Stuttgart (DE); Carsten Pipper, Gerlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 548 days.

(21) Appl. No.: 13/321,232

(22) PCT Filed: Aug. 2, 2010

(86) PCT No.: PCT/EP2010/061219
§ 371 (c)(1),
(2), (4) Date: Feb. 8, 2012

(87) PCT Pub. No.: WO2011/015558
PCT Pub. Date: Feb. 10, 2011

(65) Prior Publication Data
US 2012/0125129 A1 May 24, 2012

(30) Foreign Application Priority Data

Aug. 6, 2009 (DE) .......................... 10 2009 028 285

(51) Int. Cl.
*G01N 17/00* (2006.01)
*H01M 10/42* (2006.01)
*A62C 99/00* (2010.01)
*G01R 31/36* (2006.01)
*H01M 10/0525* (2010.01)

(52) U.S. Cl.
CPC ........... *H01M 10/4285* (2013.01); *A62C 99/00* (2013.01); *G01R 31/3627* (2013.01); *H01M 10/0525* (2013.01)

(58) Field of Classification Search
CPC ................................. E06B 5/12; G01N 17/00
USPC ............ 73/865.6, 865.9, 866; 109/58, 64, 75, 109/78–85
See application file for complete search history.

(56) References Cited

U.S. PATENT DOCUMENTS

| 4,967,608 | A | * | 11/1990 | Yost | ................................ 73/866 |
| 5,637,812 | A | * | 6/1997 | Baker et al. | .................. 73/865.6 |
| 6,789,363 | B1 | * | 9/2004 | Frase et al. | ................... 52/220.8 |

FOREIGN PATENT DOCUMENTS

| DE | 3716914 | | 11/1988 |
| DE | 19644048 | * | 5/1998 |
| DE | 20013299 | | 12/2000 |

(Continued)

OTHER PUBLICATIONS

International Search Report, PCT International Application No. PCT/EP2010/061219, dated Dec. 14, 2010.

*Primary Examiner* — Herzon E Williams
*Assistant Examiner* — Hoang Nguyen
(74) *Attorney, Agent, or Firm* — Kenyon & Kenyon LLP

(57) ABSTRACT

A protective device for a test installation, the test installation being used for testing objects that have a tendency to burn and emit gas, in particular for testing lithium-ion batteries, and the test installation having a test chamber that is sealable via a door-type opening element with the interposition of a sealing element, and having a testing device configured in the test chamber for the objects. The test chamber includes a venting device for gases and is surrounded by a sealed enclosure.

26 Claims, 1 Drawing Sheet

(56) References Cited

FOREIGN PATENT DOCUMENTS

| DE | 202008007663 | * | 9/2008 |
| FR | 2832655 | * | 5/2003 |
| WO | WO 00/29685 | | 5/2000 |
| WO | WO 2011015613 A3 | * | 2/2011 |

* cited by examiner

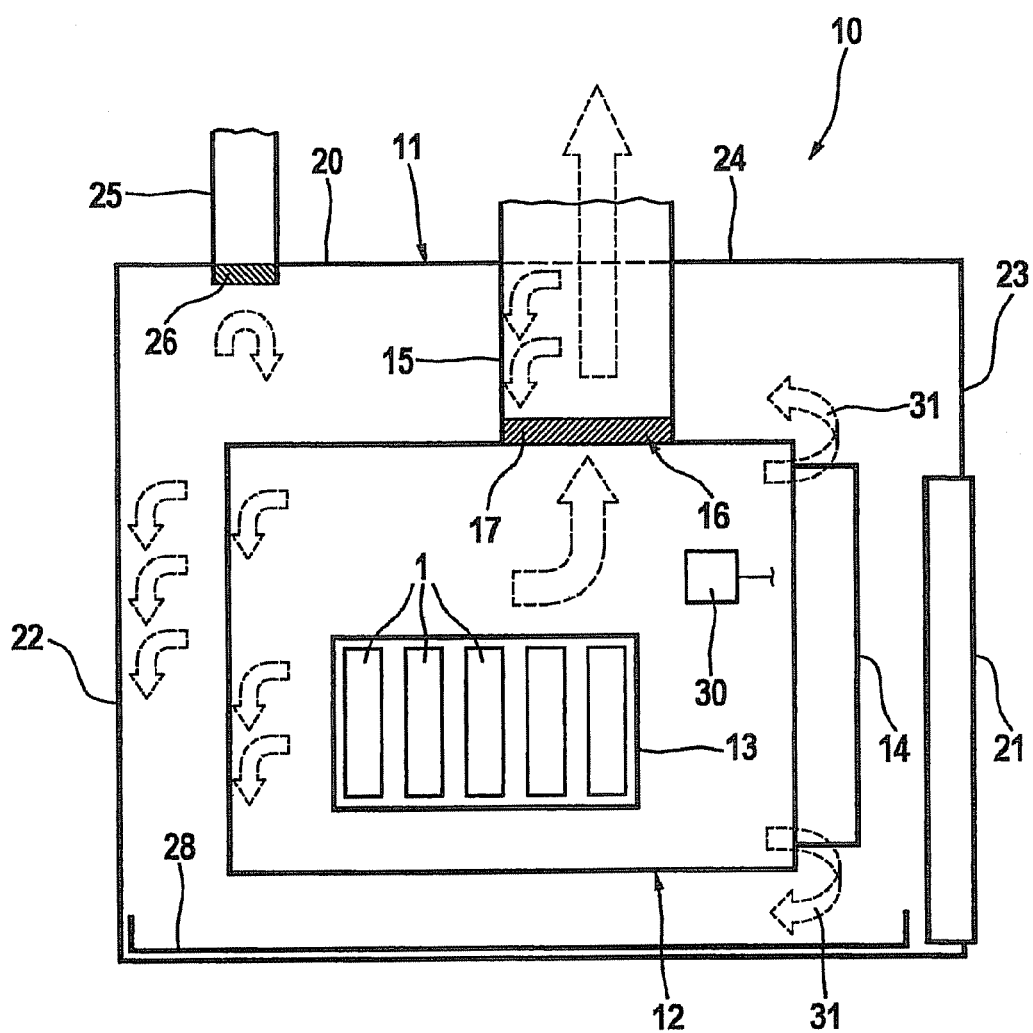

PROTECTIVE DEVICE FOR A TEST INSTALLATION

FIELD OF THE INVENTION

The present invention relates to a protective device for a test installation.

BACKGROUND INFORMATION

Protective devices are used in the industry in a wide range of adaptations. Problematic, however, are those applications in which noxious or environmentally harmful gases are produced when objects burn. These gases must be prevented from coming in contact with people, in particular. Particularly during testing of lithium-ion batteries, damage thereto can cause noxious gases to be emitted whose noxious substances can be bound by water, respectively by moisture present in the air. Also problematic when working with lithium-ion batteries, in particular, is that burning can cause them to produce very high temperatures that are released to the ambient environment. These high temperatures are capable of damaging a seal configured near a door of the test chamber, allowing gases to escape therefrom.

SUMMARY

It is an object of the present invention to further develop a protective device for a test installation in a way that, on the one hand, will allow the gases produced by a burning of the objects to be diverted in a controlled manner from the test chamber and that, on the other hand, will ensure at all costs that the gases outside of the test chamber are prevented from being able to reach the ambient environment in an uncontrolled manner. This objective may be achieved by a protective device for a test installation in accordance with the present invention. In accordance with the present invention on the one hand, a venting device is used to allow the gases to flow out directly from the test chamber, and, on the other hand, a sealed enclosure that surrounds the test chamber is used to prevent gases, which escape to the area outside of the test chamber due to a damaged door seal, from being emitted uncontrollably into the ambient environment. This is made possible by a second space that is formed by the enclosure and surrounds the test chamber.

Any combinations of at least two of the features described herein or shown in the figures come under the scope of the present invention.

One preferred embodiment of the present invention provides for the enclosure to have an at least 30 minute (F30) fire resistance, in particular a 90 minute (F90) fire resistance. This design provides a sufficient period of time for the fire to be extinguished inside of the test chamber. A high degree of safety is also made possible to protect against gases escaping from the enclosure.

Another embodiment of the present invention provides that the enclosure feature a gas discharge vent having a sealable fire protection flap. Should damage, respectively fire occur, the sealable fire protection flap is able to encapsulate the enclosure, making it possible to rule out any escaping of gases from the enclosure.

It is also provided that the protective housing feature a smoke-tight door. Thus, on the one hand, access is provided in the first instance to the enclosure and, subsequently, to the test chamber, and, on the other hand, the smoke-tight design of the door prevents gases from escaping should damage occur.

As previously explained, the noxious substances produced, particularly in the case of burning of lithium-ion batteries, may be bound by moisture, respectively water. Therefore, one especially preferred embodiment of the present invention provides for a notably trough-shaped collection device for condensed moisture, in particular, to be configured in the bottom area of the protective housing, and for it to be disposed in operative connection at least with the side walls of the protective housing. This allows the moisture that forms, along with the noxious substances bound therein, to reach the collection device in the case that an intermixing with the relatively cool air in the enclosure causes the gases to condense on the inner walls thereof, making it possible to readily dispose of the noxious substances, together with the moisture, respectively liquid.

It is, moreover, particularly advantageous that the collection device substantially cover the entire bottom area of the protective housing to enable the condensate, along with the noxious substances, to be entirely collected, and the test chamber to be configured within the surface area of the collection device. This will also enable condensate or moisture to be collected from the test chamber by the collection device.

An especially simple ease of cleaning of the enclosure prior to restarting test device operation is provided following the occurrence of damage when the side walls feature an essentially smooth-surfaced form without any undercuts. This makes it possible, at the same time, for the moisture to readily flow off into the area of the collection device.

Another embodiment of the present invention provides for the venting device to be in the form of a flue. This allows any gases produced in the burning process to be readily diverted from the test chamber, the flue design permitting a relatively high gas throughput.

It may be provided for a sealing element to be configured in the flue. This sealing element is then usually sealed during normal testing of the objects, so that the test chamber is outwardly impervious. This is particularly advantageous when the test chamber is designed as a temperature chamber since heat losses may then be minimized.

A rupture disk design of the sealing element is especially preferred. A rupture disk has the advantage of featuring a virtually inertialess response already at relatively low overpressures, thereby allowing the gases to be reliably diverted from the test chamber.

To be able to recognize the occurrence of damage and, as the case may be, for example, to automatically close the fire protection flap in the enclosure or to be able to automatically actuate other safety or fire-extinguishing devices, it is provided, moreover, for a sensor device, in particular a fire detection device, to be configured within the test chamber or the enclosure to detect the occurrence of damage.

Other advantages and features of the present invention and details pertaining thereto are described below in the context of preferred exemplary embodiments, as well as in light of the FIGURE.

BRIEF DESCRIPTION OF THE DRAWING

The FIGURE shows a schematic longitudinal section through a protective device for a test installation.

DETAILED DESCRIPTION OF EXAMPLE EMBODIMENTS

A protective device 10 for a test installation 11 is shown in the FIGURE. Test installation 11 encompasses a test chamber 12 designed, in particular, as a temperature chamber. Configured in test chamber 12 is a testing device 13. In the illustrated exemplary embodiment, testing device 13 is used for testing objects that have a tendency to burn and emit gas, in particular for testing lithium-ion batteries. Testing device 13 is used for accommodating five lithium-ion cells 1, for example.

Test chamber 12 is sealable by a test chamber door 14, a sealing device, respectively a door seal (not shown) being provided between test chamber 12 and test chamber door 14. A flue 15 leads into the upper region of test chamber 12. A sealing element 16 in the form of a rupture disk 17 is configured in the outlet region of flue 15 at test chamber 12. However, in place of a rupture disk 17, a sealing device 16 of a different design, for example in the form of a sealing flap or the like, may also be provided. Alternatively, it is also conceivable to dispense altogether with a sealing element 16.

Test installation 11 described up to this point is configured within an enclosure 20. Enclosure 20 is formed as a fully encapsulated space, i.e., is sealable against the ambient environment. To this end, enclosure 20 has a smoke-tight door 21 on one side, for example, via which access to enclosure 20 and also to test chamber 12 via test chamber door 14 is possible.

Side walls 22, 23, as well as preferably also cover 24 of enclosure 20 have an essentially smooth-surfaced form without any undercuts. Overall, enclosure 20 has a fire-resistant design in that it features an at least 30 min. (F30) fire resistance, in particular, better than 90 min. (F90). A vent pipe 25 having a fire protection flap 26 configured therein leads into cover 24 of enclosure 20.

A notably trough-shaped collection reservoir 28 is configured in the bottom area of enclosure 20. In this context, collection reservoir 28 advantageously covers, in particular, the entire bottom surface area of enclosure 20, so that test installation 11 is configured within the bottom surface area of collection reservoir 28. In particular, it is also provided that side walls 22, 23 of the enclosure be disposed in operative connection with collection reservoir 28 in a way that allows moisture or liquid condensing on side walls 22, 23 to run down the same into collection reservoir 28.

Also situated exemplarily within enclosure 20, respectively test chamber 12, is a sensor device 30. Sensor device 30 is designed, for example, as a fire detection device and communicates with a control device (not shown) that, for example, controls fire protection flap 26 and, optionally, other devices as well.

The functioning of protective device 10 described up to this point is explained in the following: Should lithium ion cells 1 fail in test device 13, resulting in fire, gas emission and/or an explosion, the thereby produced gases are drawn off mainly via flue 15 to the ambient environment. The passage between test chamber 12 and flue 15 is either established by a bursting of rupture disk 17, or, however, by controlling sealing element 16 accordingly. As burning continues, the door seal between test chamber 12 and test chamber door 14 may be damaged by the action of heat, allowing gases from test chamber 12 to get into the interior of enclosure 20, as indicated by arrows 31. At the latest, at this instant, sensor device 30 detects the fire and responds by sealing fire protection flap 26. As the result of intermixing with the relatively large, cold gas volume in enclosure 20, the escaping gas containing the noxious substances now condenses on the inner walls of enclosure 20, in particular on side walls 22, 23 and cover 24. As the gas condenses, the condensate runs down the walls in question and arrives in collection reservoir 28. Collection reservoir 28 may be optionally equipped with an additional outlet in case greater quantities of condensate form, particularly if an additional spray or extinguishing system for spraying water or mist is located inside enclosure 20 or test chamber 12.

What is claimed is:

1. A protective device for a test installation, the test installation being used for testing objects that have a tendency to burn and emit gas, including lithium-ion batteries, comprising:
   a test chamber that is sealable via a door-type opening element with interposition of a sealing element, and has a testing device configured in the test chamber for the objects, the test chamber including a venting device for gases, and being surrounded by a sealed enclosure,
   wherein the enclosure includes a gas discharge vent having a sealable fire protection flap.

2. The protective device as recited in claim 1, wherein the enclosure has an at least 30 minute fire resistance.

3. The protective device as recited in claim 2, wherein the enclosure has a 90 minute fire resistance.

4. The protective device as recited in claim 1, wherein the venting device is a flue.

5. The protective device as recited in claim 4, wherein a sealing element is disposed in the flue.

6. The protective device as recited in claim 5, wherein the sealing element is a rupture disk.

7. The protective device as recited in claim 1, wherein a sensor device for detecting an occurrence of damage to the objects is configured within one of the test chamber or the enclosure.

8. The protective device as recited in claim 7, wherein the sensor device is a fire detection device.

9. A protective device for a test installation, the test installation being used for testing objects that have a tendency to burn and emit gas, including lithium-ion batteries, comprising:
   a test chamber that is sealable via a door-type opening element with interposition of a sealing element, and has a testing device configured in the test chamber for the objects, the test chamber including a venting device for gases, and being surrounded by a sealed enclosure,
   wherein the sealed enclosure has a smoke-tight door.

10. The protective device as recited in claim 9, wherein the venting device is a flue.

11. The protective device as recited in claim 10, wherein a sealing element is disposed in the flue.

12. The protective device as recited in claim 11, wherein the sealing element is a rupture disk.

13. The protective device as recited in claim 9, wherein a sensor device for detecting an occurrence of damage to the objects is configured within one of the test chamber or the enclosure.

14. The protective device as recited in claim 13, wherein the sensor device is a fire detection device.

15. The protective device as recited in claim 9, wherein the enclosure has at least a 30-minute fire resistance.

16. The protective device as recited in claim 9, wherein the enclosure has a 90 minute fire resistance.

17. A protective device for a test installation, the test installation being used for testing objects that have a tendency to burn and emit gas, including lithium-ion batteries, comprising:
   a test chamber that is sealable via a door-type opening element with interposition of a sealing element, and has a testing device configured in the test chamber for the objects, the test chamber including a venting device for gases, and being surrounded by a sealed enclosure, wherein a trough-shaped collection device for condensed moisture is configured in a bottom area of the sealed enclosure, and is disposed in operative connection at least with side walls of the sealed enclosure.

18. The protective device as recited in claim 17, wherein the collection device substantially covers the entire bottom area of the sealed enclosure, and the test chamber is configured within the surface area of the collection device.

19. The protective device as recited in claim 18, wherein at least the side walls of the enclosure have a smooth-surfaced form without any undercuts.

20. The protective device as recited in claim 17, wherein the venting device is a flue.

21. The protective device as recited in claim 20, wherein a sealing element is disposed in the flue.

22. The protective device as recited in claim 21, wherein the sealing element is a rupture disk.

23. The protective device as recited in claim 17, wherein a sensor device for detecting an occurrence of damage to the objects is configured within one of the test chamber or the enclosure.

24. The protective device as recited in claim 23, wherein the sensor device is a fire detection device.

25. The protective device as recited in claim 17, wherein the enclosure has at least a 30-minute fire resistance.

26. The protective device as recited in claim 17, wherein the enclosure has a 90 minute fire resistance.

\* \* \* \* \*